United States Patent [19]

Ohkawa et al.

[11] Patent Number: 5,149,681

[45] Date of Patent: Sep. 22, 1992

[54] MELT TEXTURING OF LONG SUPERCONDUCTOR FIBERS

[75] Inventors: Tihiro Ohkawa, La Jolla; Richard B. Stephens; Albert J. Lieber, both of Del Mar, all of Calif.

[73] Assignee: General Atomics, San Diego, Calif.

[21] Appl. No.: 523,221

[22] Filed: May 14, 1990

[51] Int. Cl.[5] ............................................. B32B 9/00
[52] U.S. Cl. ....................................... 505/1; 505/701; 505/702; 505/703; 505/704; 428/688; 428/930; 428/457; 428/901; 29/899
[58] Field of Search ................. 505/1, 701.4; 428/457, 428/688, 901, 930; 29/899

[56] References Cited

U.S. PATENT DOCUMENTS

| 4,931,424 | 6/1990 | Henty | 427/53.1 |
| 4,948,779 | 8/1990 | Keur et al. | 428/930 |
| 4,966,142 | 10/1990 | Zimmerman et al. | 228/263.12 |

FOREIGN PATENT DOCUMENTS

| 3806174 | 9/1989 | Fed. Rep. of Germany . |
| 3806176 | 9/1989 | Fed. Rep. of Germany . |
| 3806178 | 9/1989 | Fed. Rep. of Germany . |

OTHER PUBLICATIONS

Mat. Res. Soc. Symp., vol. 138 (1989) Gai et al., p. 143-ff, Synthesis, Microstructive & Local Chemistry of SC BiSrCuCuO thin film.

Applied Phys. Letters, vol. 53, No. 26, Dec. 26, 1988, pp. 2677-2679, Simon et al.

Primary Examiner—Patrick J. Ryan
Assistant Examiner—T. A. Powers
Attorney, Agent, or Firm—Nydegger & Associates

[57] ABSTRACT

A pre-existing superconductor ceramic which is bonded to a substrate is passed through a relatively short heating zone to melt the ceramic superconductor. As the superconductor is subsequently cooled after it has passed through the heating zone, a temperature gradient is established along the superconductor which causes the melted crystals to renucleate and grow along and parallel to the temperature gradient. The resulting crystalline structure exhibits improved superconducting properties when the superconductor is placed in the presence of a magnetic field. For appropriate applications, the substrate can be formed as a wire.

24 Claims, 2 Drawing Sheets

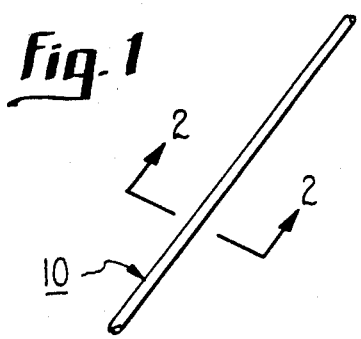
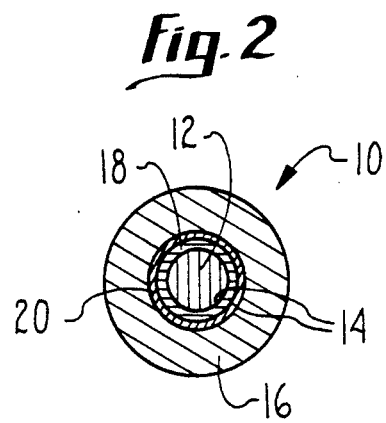
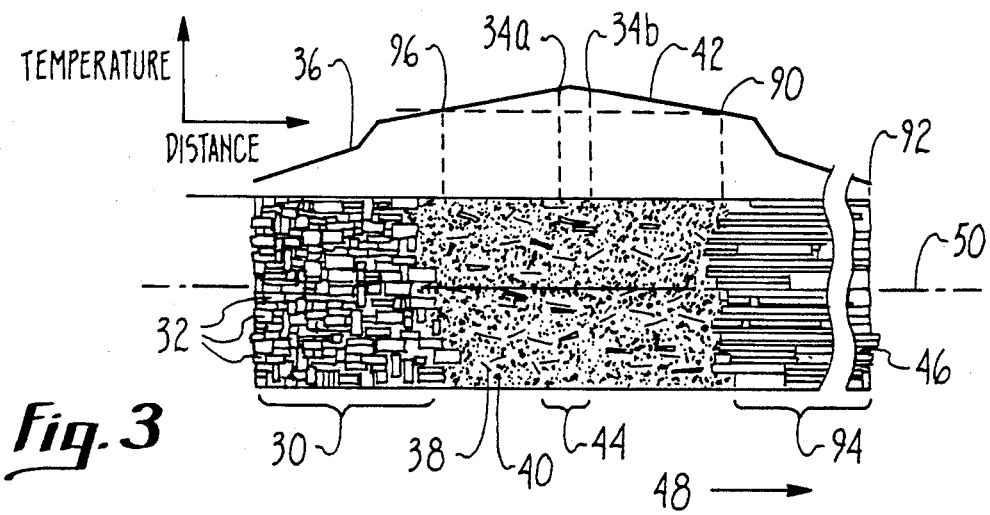
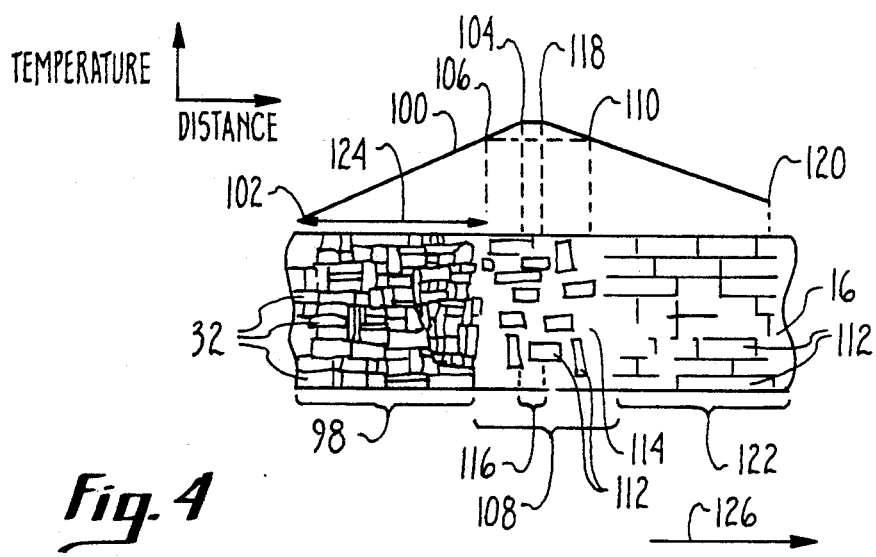

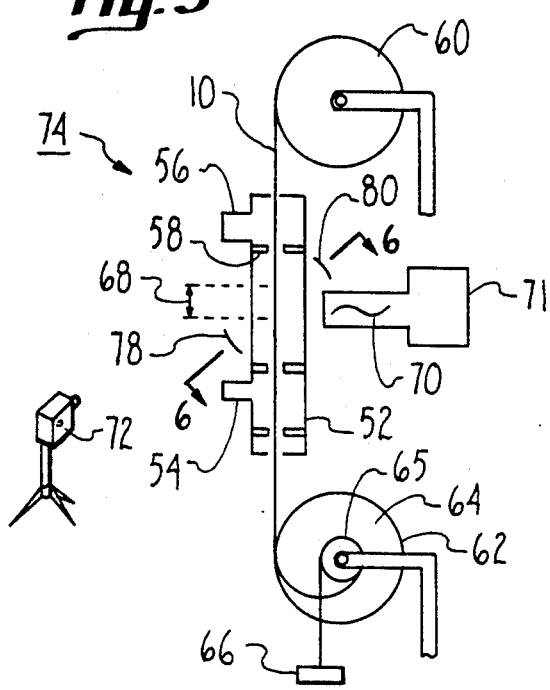
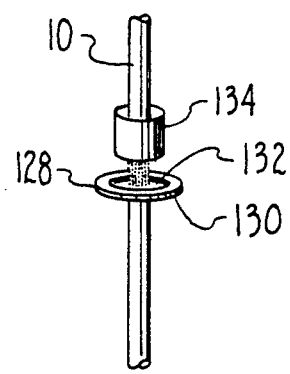
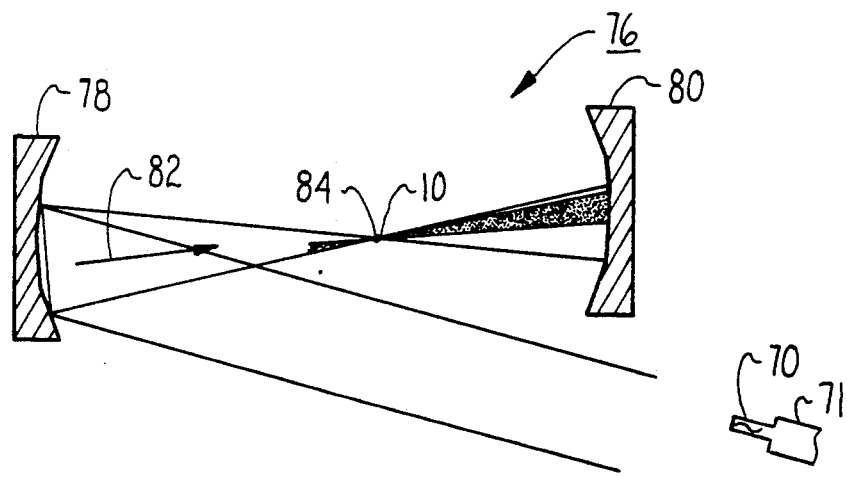
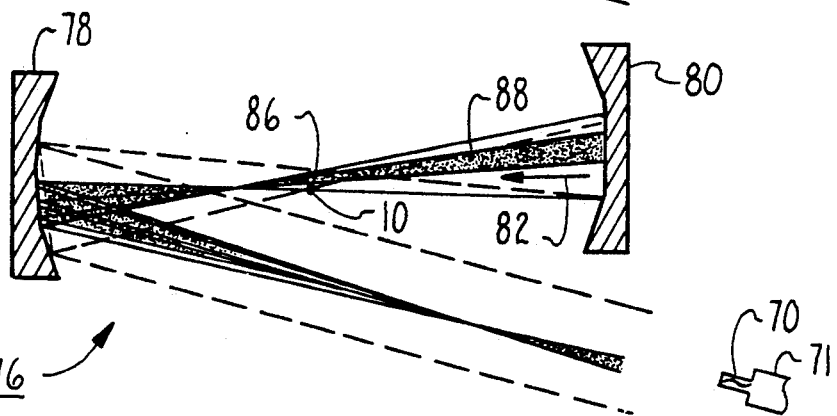

MELT TEXTURING OF LONG SUPERCONDUCTOR FIBERS

FIELD OF THE INVENTION

The present invention relates generally to apparatus and systems for superconductor applications More particularly, the present invention relates to a superconducting ceramic material which is bonded to a substrate with the crystals of the ceramic substantially parallel to each other and elongated along the substrate. The present invention is particularly, though not exclusively, useful as a superconducting wire for applications which require superconductors that exhibit zero resistance at high current densities in the presence of a magnetic field.

BACKGROUND OF THE INVENTION

It is well known that certain ceramics have unique electrical superconducting characteristics and properties which make them extremely well suited for a wide range of specific applications. Indeed, many additional applications for these so-called ceramic superconductors are still being determined. Ceramic superconductors, however, are quite brittle and can be easily damaged. Thus, to a very great extent, the effectiveness of any particular application for the superconductor depends on the ability to establish a platform which will support the ceramic superconductor for its intended purpose.

Such a supporting platform is disclosed and claimed in the U.S. patent application of Woolf, et al., Ser. No. 07/265,827, which is assigned to the same assignee as the present invention. The particular structure disclosed is a metallic wire substrate which supports a superconductor having constituent elements that include a rare earth (RE) together with Barium (Ba), Copper (Cu), and Oxygen (O). Typically, this superconductor is designated $RE\ Ba_2\ Cu_3\ O_{7-x}$ and is familiarly known as a 1-2-3 superconductor.

Ceramic superconductors are formed in polycrystalline structures and, generally, the 1-2-3 crystals are randomly oriented in the ceramic with respect to each other. As is well known, ceramic objects are produced according to a selected process and normally the orientation of individual crystals within the ceramic is of no concern. On the other hand, insofar as superconducting ceramics are concerned the particular crystalline structure of the ceramic is important for several reasons. Firstly, on the atomic level, the structures within these crystals are highly oriented. It so happens that the particular geometric orientations of these structures define the directions along which the crystal will preferentially grow. It also happens that superconducting crystalline structures are capable of conducting more current per unit area along the preferential dimensions of growth than along the dimension of non-preferential, or slower, growth. Accordingly, a superconducting ceramic will exhibit improved superconducting characteristics if the individual 1-2-3 crystals of the ceramic are aligned in a co-parallel orientation and are elongated in the direction of current flow.

In addition to the factor discussed above, the improved superconducting characteristics associated with superconductor crystalline structures having aligned, co-parallel grains are attributable to other factors as well. For instance, the boundaries between elongated crystals, which are similarly aligned in a side-by-side relationship relative to the direction of current flow, have more intersurface contact which can carry a higher superconducting current than do crystal boundaries that are formed by crystals which do not share a common crystalline alignment. Indeed, the boundaries themselves between colinearly aligned crystals have been shown to be capable of carrying more current flow than the boundaries of unaligned crystals. Secondly, crystalline structures having aligned, co-parallel crystal grains tend to have less cracking in the overall crystal structure than structures having unaligned grains, and hence have improved superconducting characteristics. In particular, one such improved superconducting characteristic is that the critical current ($J_c$) of a ceramic superconductor whose individual crystals are so aligned and elongated is larger and less affected by a magnetic field. Specifically, with its crystals properly aligned, $J_c$ for a ceramic superconductor with aligned crystals does not decrease as rapidly in the presence of a magnetic field as does the $J_c$ of a superconductor whose individual crystals are randomly oriented with respect to each other.

To provide for ceramic crystal alignment, several processes have been proposed which, when applied to ceramic crystalline structures, approximately orient the crystal grains in a given direction. Substantial intergranular misalignments, however, may still exist after ceramic structures have been processed by many of these proposed techniques. One generalized technique which ameliorates the misalignment problem by producing crystalline structures having substantially aligned and elongated crystal grains is the technique of heat texturing. This technique requires melting the ceramic structure and then establishing a thermal gradient across the structure as it cools. The effect of this technique is that the individual crystal grains which renucleate in the cooling melt and are aligned with their fast growing direction along the temperature gradient grow much faster than other grains and dominate the structure of the recrystallized ceramic.

Another process related to heat texturing which also results in substantially aligned, elongated crystal grains is the process known as Ostwald Ripening. This process first requires doping the ceramic crystalline structure with a liquid carrier, such as silver (Ag), cuprous oxide (CuO), barium oxide (BaO), or combinations of the above compounds and element. Then, the doped ceramic is heated to above the melting point of the carrier, but below the melting point of the ceramic material When so heated, however, it happens that some of the smaller ceramic crystal grains tend to enter into solution with the liquified carrier element. The extent of this dissolution is strongly dependent upon both temperature and crystal size. A proper temperature gradient is then established along the doped ceramic structure. The dissolved ceramic diffuses from regions of high solubility (higher temperature and smaller crystals) to those of low solubility (lower temperature and larger crystals), dissolving material from the high temperature end of the gradient and from small crystals, and redepositing it at the low temperature end of the gradient and preferentially onto larger crystals. Accordingly, larger crystals oriented along the temperature gradient can benefit more from this deposition because they have a larger surface area for redeposition, and can grow so that their rapid growth faces stay in the growth region longer. On the other hand, smaller, incorrectly oriented crystals tend to be dissolved. Thus, the resulting microstructure is elongated in the direction of the temperature gradient.

The particular heat texturing related techniques proposed in the past, however, are suitable only for applications involving short, relatively large cross-section ceramic bars. They are generally unsuitable for treating ceramic crystals in very long superconducting wire that are fine enough to be flexible.

It would therefore be an advancement in the art to provide a substantially long, flexible superconducting wire whose individual superconducting ceramic crystals are substantially aligned and elongated in the direction of current flow. It would be another advancement in the art to provide a superconducting ceramic with the above crystalline properties when the ceramic is bonded to a flexible wire-like substrate base. Still another advancement in the art would be to provide an electrically superconducting wire of indeterminate length, the superconducting characteristics of which are still effective in the presence of a magnetic field. It would also be an advancement in the art to produce an electrically superconducting wire at rates sufficient to make, in economic time spans, lengths of wire that are up to several kilometers long. Yet another advancement in the art would be to provide a ceramic superconductor which is relatively easy to manufacture and comparatively cost effective.

SUMMARY OF THE INVENTION

The preferred embodiment of the novel melt-textured superconductor in accordance with the present invention comprises a superconducting source ceramic supported by an oxidation-resistant metallic substrate or non-metallic substrate, such as aluminum oxide ($Al_3O_2$). Processing the superconductor under prescribed conditions causes the superconducting ceramic crystals to align and grow elongated in substantially the same direction. The process thus results in elongated ceramic crystals which provide improved superconducting properties when the superconductor is placed in the presence of magnetic fields, as compared to the properties of the pre-processed source ceramic having randomly oriented superconducting crystal grains.

In accordance with the present invention, the substrate can be of any configuration. Preferably, however, the substrate is a metallic wire for those applications in which the ceramic superconductor coating on the substrate is to be used as a very low resistance electrical conductor. Further, the superconducting ceramic may comprise a rare earth-based ceramic, or a ceramic of the Bismuth or Thallium superconducting ceramic families.

As contemplated by the present invention, a wire substrate which is coated with a ceramic superconductor is heated using any one of several heat sources. Preferably, when a wire substrate is used, a portion of the source superconductor is uniformly heated in the radial dimension by any appropriate heat source (e.g., a carbon dioxide laser). When the crystal grains are aligned and elongated using the process of heat texturing, the source ceramic superconductor is heated to just above its melting point (peritectic temperature in the case of 1-2-3 superconductor compounds) and the crystalline structure of the ceramic crystals in the heating zone are thereby destroyed. After the heating zone passes and the melt cools below the peritectic temperature, crystals renucleate. The new crystals whose rapid growth directions are oriented along the temperature gradient can grow rapidly enough to maintain a growth face in the hot zone; crystals oriented in other directions freeze before they grow very far. In addition, the presence of the growth faces of the properly oriented crystals in the recrystallization zone prevents the nucleation of any other crystals. The resulting shale-like crystalline superconductor structure is then annealed for an appropriate period in a pure oxygen atmosphere.

Alternatively, crystal grain alignment can be accomplished by a process known as Ostwald ripening. For this procedure, the source superconductor is first doped with an appropriate solvent for the superconductor, preferably silver, and then heated to above the melting point of the solvent (but below the melting point of the ceramic). When so heated, smaller ceramic grains tend to enter into solution with the heated, liquified solvent. The extent of this dissolution is strongly dependent upon temperature and crystal size. The dissolved ceramic diffuses from regions of high solubility (higher temperature and smaller crystals) to those of low solubility (lower temperature and larger crystals), dissolving material from the high temperature end of the gradient and from small crystals, and redepositing it at the low temperature end of the gradient and preferentially onto larger crystals. Accordingly, larger crystals oriented along the temperature gradient can benefit more from this deposition because they have a larger surface area for redeposition, and can grow so that their rapid growth faces stay in the growth region longer. On the other hand, smaller crystals tend to be dissolved. Thus, the resulting microstructure is elongated in the direction of the temperature gradient. The resulting elongated brick-like crystalline superconductor structure is then annealed for an appropriate period.

The novel features of this invention, as well as the invention itself, both as to its structure and its operation, will be best understood from the accompanying drawings, taken in conjunction with the accompanying description, in which similar reference characters refer to similar parts, and in which:

BRIEF DESCRIPTION OF THE DRAWINGS

FIG. 1 is a perspective view of a ceramic superconductor coated wire;

FIG. 2 is an enlarged cross-sectional view of the coated wire as seen along the line 2—2 in FIG. 1;

FIG. 3 is a schematic cross-sectional view of the ceramic layer as it appears during the heat texturing process, with a thermal gradient diagram superimposed on the layer for illustration purposes;

FIG. 4 is a schematic cross-sectional view of the ceramic layer as it appears during the Ostwald ripening process, with a thermal gradient diagram superimposed on the layer for illustration;

FIG. 5 is a simplified schematic diagram of one embodiment of the manufacturing apparatus;

FIG. 6 is a schematic view of the laser focussing optics used in the apparatus shown in FIG. 5, showing the first pass of the heating laser by the superconductor;

FIG. 7 is a schematic view of the laser focussing optics used in the apparatus shown in FIG. 5, showing the second pass of the heating laser by the superconductor; and FIG. 8 is a schematic view of an alternative manufacturing apparatus.

DESCRIPTION OF THE PREFERRED EMBODIMENT

Referring initially to FIG. 1, it will be seen that the present invention can be configured as a wire, generally designated 10. In FIG. 2, it will be seen that the wire 10 essentially comprises a substrate 12, an interaction zone 14 and a layer 16 of ceramic superconducting material. Further, it is to be appreciated that interaction zone 14 itself can comprise an oxide layer 18 which is formed on the surface of substrate 12 and an interface layer 20 which is formed between oxide layer 18 and ceramic superconductor layer 16. Importantly, interaction zone 14 should remain benign with respect to ceramic layer 16 under the processing conditions of wire 10 disclosed below. To this end, zone 14 may comprise a protective layer of barium fluoride (BaF) or a rare earth oxide. Alternatively, zone 14 may comprise rhodium (Rh) or even a 1-2-3 superconductor which has a peritectic (decomposition) temperature of up to 80° K. higher than the critical temperature of ceramic 16. When the present invention is configured as wire 10, substrate 12 is essentially an elongated cylindrical-shaped base member and interaction zone 14 is established during the initial ceramic sintering process as a layer on the surface of substrate 12. On the other hand, substrate 12 may be formed as an elongated parallelpiped, such as a flat ribbon. When substrate 12 is configured as a wire, ceramic superconductor layer 16 completely covers interaction zone 14 to establish a wire 10 in which substrate 12, interaction zone 14 and ceramic layer 16 are substantially concentric. As will be appreciated by the skilled artisan, the cooperation of these components of wire 10 is crucial to its efficacy. Alternatively, substrate 12 must have a surface layer in zone 14 which effectively prevents any interaction between the substrate and the ceramic.

Substrate 12 needs to be selected with certain characteristics in mind. First, substrate 12 must be able to provide an effective mechanical support for ceramic superconductor layer 16. Second, it should not chemically interact with the ceramic superconductor layer 16 in any way which will "poison" the ceramic layer 16 and thereby reduce its efficacy. Alternatively, substrate 12 must have a surface layer in zone 14 which prevents interaction between substrate 12 and layer 16.

With regard to the need that substrate 12 provide an effective support for ceramic layer 16, it will be appreciated by the skilled artisan that most metallic substances can be configured to satisfy this requirement. Importantly, substrate 12 must be composed of high strength, oxidation resistant material in order to maintain its integrity during the process further disclosed below. Several substrate materials may be used for this process without departing from the scope and intent of the present invention. Specifically, a Duranickel 301 alloy, as well as the nickel-based alloys set forth below in Table 1, may be used as substrate material for the present invention.

TABLE 1

| COMPOSITION OF WIRE SUBSTRATES (WEIGHT %) | | | | | | | |
|---|---|---|---|---|---|---|---|
| | Ni | Fe | Cr | Al | Si | Mn | Mg | Ti |
| Duranickel | 89.3 | | | 9.2 | 0.8 | 0.3 | | 0.4 |
| Hoskins 875 | | 71 | 23 | 5.5 | | | | |
| Alumel | 94.8 | | | | 1.5 | 1.5 | 1.7 | |
| Inconel 601 | 60 | 13 | 23 | 1.5 | 0.5 | 1.0 | | |
| Haynes 214 | 76.5 | 3 | 16 | 4.5 | | | | |
| Nisil | 95.5 | | | | 4.4 | | 0.1 | |

TABLE 1-continued

| COMPOSITION OF WIRE SUBSTRATES (WEIGHT %) | | | | | | | |
|---|---|---|---|---|---|---|---|
| | Ni | Fe | Cr | Al | Si | Mn | Mg | Ti |
| Nicrosil | 84.4 | | 14.2 | | 1.4 | | | |
| Ni₃Al | 86.7 | | | 13.3 | | | | |

In addition, substrate 12 may be composed of a non-metallic material or even be composed of superconducting ceramic material, as long as it meets the requirements of being capable of mechanically supporting the superconductor 10 structure.

In addition to the substrate material requirements above, ceramic layer 16 preferably comprises a well known superconductor having constituent elements which include a rare earth (RE) together with Barium (Ba), Copper (Cu) and Oxygen (O) Typically, this superconductor is designated RE Ba$_2$Cu$_3$O$_{7-x}$, where RE is rare earth having an atomic number between fifty seven (57) and seventy one (71) and x is in the range zero (0) to one half (0.5). This rare earth-based compound is familiarly referred to as 1-2-3 superconductor. It is to be understood, however, that other known superconductors can be used without departing from the spirit or intent of the present invention. For example, a bismuth (Bi) or thallium (Tl) based superconductor can also be used, as well as a compound designated RE Ba$_2$Cu$_4$O$_8$, familiarly known as 1-2-4 superconductor where RE is a rare earth as defined above. Additionally, ceramic layer 16 may comprise mixtures of 1-2-3 and 1-2-4 superconductors.

While the present invention disclosed herein uses a wire-like material as a substrate, it is to be understood that the invention is also applicable to other substrate configurations, such as a hollow cylinder or flat layer. For an example of a wire substrate, the diameter of substrate 12 will preferably be on the order of fifty (50) microns, the thickness of interaction zone 14 will be on the order of ten (10) microns, and the thickness of ceramic superconductor layer 16 on the order of seventy-five (75) microns.

METHOD OF MANUFACTURE

The method of manufacture for the present invention contemplates either melt-texturing or Ostwald-ripening a source superconductor wire, the ceramic crystal grains of which are initially randomly aligned within the superconducting ceramic material. In overview, the general method of processing a source material by either melt-texturing or Ostwald ripening is to pass a superconductor wire through a temperature controlled processing zone in which the ambient atmosphere may be strictly controlled. For example, it is desireable that a pure oxygen atmosphere exists in the processing zone when processing 1-2-3 ceramics, while a substantially lower oxygen content is required for processing bismuth-based ceramics. As the source wire passes through the processing zone, a very short section of the wire is radially uniformly heated to a predetermined temperature. This very short section of wire is preferably no longer than the diameter of the wire. Both the speed of the wire through the processing zone and the heating of the short section of wire are precisely controlled during the process. As the skilled artisan will appreciate, a precise thermal gradient in the longitudinal direction of the wire may thereby be established to properly align and elongate the individual ceramic crystals during cooldown after heating. More particularly, the cooldown temperature gradient of the wire may be controlled by controlling heat input to the wire or, alternatively, limiting heat radiation from the wire. The processed product wire is then annealed for a specified time and temperature (for example, it is preferable to anneal 1-2-3 ceramic of the dimensions disclosed herein for about three days at 400°-500° C., whereas a bismuth-based ceramic should be annealed for about two days at 840°-845° C.).

The solid state dynamics of the process disclosed above may be more particularly described in reference to FIGS. 3 and 4. Specifically, the melt-texture processing method is best seen with reference to FIG. 3. In the representation illustrated in FIG. 3, it may be seen that a pre-existing ceramic superconductor 1-2-3 crystal structure 30 comprises a plurality of randomly oriented individual grains 32. As a relatively short section 44 of ceramic 16 is directly heated, the heat is conducted along ceramic 16 to establish a temperature gradient 36 along ceramic 16. The ceramic 16 is thereby heated to its melting point (peritectic temperature in the case of 1-2-3 superconductor), indicated by point 96 of temperature profile 36. At point 96, the 1-2-3 grains 32 decompose into precipitates 38 ($RE_2BaCuO_x$, familiarly known as 211 precipitates) and a melt of Ba-Cu-O, designated 40. As is known in the art, 1-2-3 ceramic material decomposes at about 1,025° C. when the RE is Dy or Y. On the other hand, bismuth-based ceramic melts at about 950° C. In order to establish a precise temperature cooling gradient 42, the importance of which is more fully disclosed below, only a very short section 44 of wire 10 is directly heated or irradiated by a heat source, such as a laser. Accordingly, the length 44 corresponds to the width of the heat zone directly irradiated by the heat source. Typically, the length of heated section 44 and hence the heat zone width is less than one millimeter, or on the approximate order of one third ($\frac{1}{3}$) millimeter. As will be appreciated by the skilled artisan, the length of heat zone 44 and the speed with which the wire 10 is passed through heat zone 44 establishes the shape of gradient 42. When gradient 42 is properly established, elongated 1-2-3 grains 46 begin to renucleate and grow at point 90 of gradient 42. By way of example, and not by way of limitation, for the process shown in FIG. 3, the temperature at point 90 is approximately 1,025° C., or 45°-75° C. higher than the temperature of point 92 of gradient 36. It will be appreciated that because the crystal temperature zone for crystal growth of 1-2-3 grains is in the approximate range of 1,025° C. to 950° C., the distance 94 on wire 10 between points 90 (1,025° C.) and 92 (950° C.) on gradient 36 represents the length of the approximate crystal growth zone. While in the present process distance 94 is about one millimeter, it may extend 5-10 millimeters in other processes. The magnitude of distance 94 may be increased by adding heat, or by using reflectors to reduce heat loss.

Moreover, the time dependence of gradient 42 is established by both the speed with which wire 10 is drawn through heat zone 44 and the heat conduction characteristics of wire 10. These heat conduction characteristics can be calculated by means well known in the art, such as, for example, by using the appropriate characteristic Bessel function for the geometry and composition of the wire 10 being heated. In one method of manufacture, the rate at which wire 10 is drawn through the temperature gradient 42 zone described above establishes the cooling rate for the wire 10. Exemplary of this method the wire 10 spends approximately one minute between points 34b and 90, and substantially longer between points 90 and 92. The temperature gradient 42 described above has been found to effectuate the desired 1-2-3 crystal renucleation and growth previously described. When gradient 42 is established as described above, grains 46 grow in the direction of arrow 48. Arrow 48 also indicates the direction of wire movement through the processing zone. As described above, the wire 10 is uniformly heated in its radial dimension, while gradient 36 is moving along longitudinal axis 50 of wire 10. It therefore happens that any grains 46 which initially renucleate with their primary growth axes substantially oriented in directions other than along the axis 50 will be unable to further elongate in the direction of their primary growth axes. For example, grains which renucleate with their primary growth axes perpendicular to axis 50 cannot grow fast enough along the wire so as to maintain a growth face in the zone between points 90 and 92. Accordingly, only grains 46 that initially renucleate with their primary growth axes substantially parallel to wire axis 50 (and, hence, gradient 42) will therefore be able to grow fast enough to keep up with the moving growth zone.

As disclosed above, the speed with which wire 10 is drawn through the processing zone is related to proper crystal renucleation and growth. Wire speeds of less than five to fifty (5-50) centimeters per hour have been found to be slow enough to allow the rapid growth faces to stay in the crystal growth zone long enough for substantial elongation. With more precise control of heating zone 44, it is possible that faster speeds may be used and still facilitate proper ceramic crystal growth. Subsequent to this heat texturing, the wire 10 must be annealed in oxygen at between 300°-500° C. for an appropriate length of time (for example, up to three days) to properly regulate the oxygen content of the 1-2-3 coating.

For a specific, not optimum, example, we took 3 mil diameter Hoskins V388 which was electrophoretically coated with about 3 mils of $DyBa_2Cu_3O_7$ (batch 10187-15-2). The fiber was sintered at about 800° C. in oxygen. It was then run at 0.1 m/hr in oxygen through a hot zone which was maintained at 1,030° C. The fiber was then oxygen annealed for about 2 days at 300°-400° C. The fiber had zero resistance below 72K. The critical current of this fiber was measured at 53K to be about 800 $A/cm^2$ with zero applied field and 200 $A/cm^2$ with an applied field of 1,000 Oe. This factor of four reduction in current carrying capacity is characteristic of our melt textured wires and markedly better than the factor of 100 reduction in $J_c$ typical of wires with an unoriented microstructure.

A superconductor processing method which is related to the heat-texturing process disclosed above is the process known as Ostwald Ripening. The details of the solid state dynamics induced by Ostwald Ripening are best seen in FIG. 4. There, pre-existing ceramic superconductor 1-2-3 crystal grains 32, which comprise unprocessed segment 98 of ceramic layer 16, are seen randomly aligned and are not elongated. The ceramic crystal structure of unprocessed segment 98 has been doped with a carrier impurity element (not shown), such as, for example, silver (Ag). Segment 98 is then subjected to a relatively strong temperature gradient 100 between points 102 and 104 of gradient 100. Corresponding to this portion of gradient 100 is distance 124 of ceramic 16, which is approximately 1 millimeter in length. When the temperature of ceramic 16 reaches point 106 of gradient 100, which is above the melting point temperature of the carrier impurity (951° C. for silver) but below the melting temperature of the ceramic (1,025° C.), the silver carrier impurities which dot the ceramic 16 crystal structure begin to melt. More particularly, the relatively smaller crystals 32 have a higher solubility in the carrier solution than the relatively larger crystals 32. Thus, material is transferred from smaller crystals to larger crystals. Accordingly, as seen in FIG. 4, segment 108 of ceramic 16, which is that portion of ceramic 16 between points 106 and 110, comprises relatively large ceramic crystal grains 112 and silver-ceramic solution 114. As the skilled artisan will recognize, silver-ceramic solution 114 therefore comprises silver melt and ceramic material from relatively small ceramic grains 32 which have entered into solution with the molten silver. Within segment 108 is heat zone 116, which is located between points 104 and 118 of gradient 100, and which is approximately one-third ($\frac{1}{3}$) millimeter in length. It will be appreciated that heat zone 116 is that portion of ceramic 16 that is directly irradiated or heated by the particular apparatus used to heat ceramic 16. At point 118, which is at the same temperature as point 104, silver-ceramic solution 114 begins to cool. As it cools, the remainder of the 1-2-3 precipitates onto existing crystal faces and the liquid 114 freezes at point 110, which is at the same temperature as point 106. Throughout this redeposition process, larger crystals 112 which are oriented along the temperature gradient 100 grow the most (they have a larger surface area for redeposition, and can grow so that their rapid growth faces stay in the growth region longer), while smaller crystals tend to be dissolved. Thus, the resulting microstructure is elongated in the direction of gradient 100 (i.e., in the direction of arrow 126).

As previously disclosed, the Ostwald Ripening process described above requires heating doped ceramic 16 to above the melting temperature of the carrier impurity (951° C. for silver, which is the impurity of preference), but below the melting temperature of the ceramic. Therefore, points 106 and 110 of gradient 100 are approximately 1,000° C. Furthermore, ceramic material which has previously entered solution with the melted carrier impurity is re-deposited back onto existing crystal grains 112 in the temperature range of about 950° C.-1,000° C.; accordingly, the temperature of point 120 on gradient 100 is approximately 950° C. It will therefore be appreciated that because gradient 100 is relatively strong between points 110 and 120, on the order of approximately 50° C. temperature change per millimeter of wire 10, segment 122 of ceramic 16 is correspondingly short. Specifically, segment 122 of ceramic 16, which is that portion of ceramic 16 between points 110 and 120 of gradient 100, is between one (1) and two (2) millimeters in length.

As can be appreciated from the above disclosure, several types of apparatus may be used to heat wire 10 and still fall within the scope and intent of the present invention. The heating apparatus disclosed herein is but one embodiment of an acceptable heating apparatus. Furthermore, apart from the particular apparatus used, several heating methods to heat wire 10 are available and fall within the scope of the present invention, such as heating filaments applied to wire 10. For the present disclosure, a focussed laser beam has been found to be effective in establishing precisely-controlled heating zones. One such laser-heating apparatus, generally designated 74, may be seen in FIG. 5. There, it will be seen that wire 10 is passed through quartz tube 52 for heating. Tube 52 may be purged with an oxygen atmosphere by directing oxygen into port 54, through tube 52, and out oxygen bubbler 56. Tube 52 is constructed with guides 58 which closely support and guide the wire 10 as it passes through tube 52. To properly support and guide the wire 10, guides 58 are approximately 20 mils in diameter, with the individual guides 58 spaced approximately 5 centimeters apart. Wire 10 is drawn through tube 52 at a predetermined rate, the importance of which is disclosed above, by variable speed motor 60. Near its end opposite to motor 60, wire 10 is guided around the periphery 62 of wire supply wheel 64 by pully 65 and thence attached to weight 66, which establishes a proper tension on wire 10 to minimize radial movement of wire 10 within the clearances of guides 58.

Still referring to FIG. 5, a heat zone 68 is shown as being established by a laser beam 70 generated by a laser source 71. While various laser sources 71 may be used to establish heat zone 68, a 25 watt, 10 micrometer wavelength carbon dioxide ($CO_2$) laser operating in the TEMoo mode has been found to provide relatively precise control of temperature gradient 42 within and immediately adjacent to heat zone 68. Such a source 71 also allows for careful monitoring of the temperature of heat zone 68 by pyrometry. To this end, an infrared pyrometer 72 with a sensitivity of approximately $\pm$ two and one half ($\pm 2.5$)° C. is provided for use in conjunction with apparatus 74. Concave mirrors 78 and 80 are also shown in schematic and may be seen in detail in reference to FIGS. 6 and 7.

Specifically, with the light directive capabilities of concave mirrors 78 and 80, heating of wire 10 in heat zone 68 is preferably uniform across wire 10. That is, wire 10 preferably undergoes uniform radial heating. It will therefore be appreciated that laser beam 70 should irradiate wire 10 substantially uniformly around that area of wire 10 which is within the heat zone 68 established by laser 70. To this end, a laser focussing optic 76 shown in FIGS. 6 and 7, is provided as a component of the heating apparatus 74. Referring to FIGS. 6 and 7, it can be seen that laser focussing optic 76 comprises the two concave mirrors 78 and 80 which are particularly oriented with respect to each other and wire 10. Specifically, it is seen that when mirrors 78 and 80 are properly oriented, the first pass of incident beam 82 from laser 70 is focussed on side 84 of wire 10, shown in FIG. 6. FIG. 7 shows that incident beam 82 is then reflected and focussed by concave mirror 80 to irradiate side 86 of wire 10 in a second pass. Thus, as shown in FIGS. 6 and 7, the placement and focal length of mirror 80 substantially refocusses onto side 86 of wire 10 that portion of light beam 82 which missed wire 10 on its first pass, which in turn reduces the size of unwanted shadow zone 88 that is cast by wire 10 and thereby results in substantially uniform radial heating of wire 10. It will be appreciated that the particular angular and spatial relationship between mirrors 78 and 80 will depend on the particular size, shape, and overall geometry of the apparatus 74 being used. Moreover, the skilled artisan will recognize that other schemes (not shown) for achieving substantially uniform radial heating of wire 10 may be employed. For example, beam 82 may be split into many beams, with each of the beams subsequently being focussed onto wire 10 from different directions. Alternatively, beam 82 may be rapidly steered around wire 10, or may be coaxial with wire 10 and then focussed onto the desired location of wire 10 by a mirror which is itself coaxial with wire 10.

FIG. 8 shows one example of an alternative heat texturing apparatus for heating wire 10 which employs the overall apparatus 74 design shown in FIG. 5, except that laser 70 in FIG. 5 has been replaced with a heat ring 128. It is to be appreciated that heat ring 128 is coaxially disposed around wire 10 to uniformly heat wire 10 in the radial direction. It will be further appreciated that ring 128 may be heated by a variety of methods, including irradiation by laser beams, radiofrequency induction, microwave coupling, electric resistive heating, or by exposure of ring 128 to hot gas. Importantly, ring 128 provides a thermal mass which damps out fluctuations of thermal power in the ring to better effect uniform radial heating of wire 10. Preferably, ring 128 is coated with a layer 130, which has low thermal emissivity characteristics, on the outside edge and upper and lower surfaces of ring 128. The function of layer 130 is to limit radiative heat loss from ring 128 in directions other than toward wire 10. On the other hand, ring 128 may have a high thermal emissivity coating 132 disposed on the inside edge of ring 128 to maximize radiative thermal emissivity from ring 128 toward wire 10. Preferably, coating 132 comprises a substance such as 1-2-3 superconductor which, in addition to having high thermal emissivity characteristics, also tends to limit the loss of barium oxide (BaO) from the surface of the superconductor of wire 10. Coating 132 which comprises 1-2-3 superconductor limits the loss of BaO because when coating 132 is heated, it provides a relatively low positive pressure of BaO vapor over the region of wire 10 that is adjacent ring 128. Although not shown in FIG. 8, it is to be appreciated that additional heating rings may be added axially to the single ring 128 shown in FIG. 8 to more precisely control the cooldown temperature gradient of wire 10. Finally, a tube 134, which is coated with an appropriate reflective substance such as gold (Au), may also be positioned coaxially with wire 10 to reflect radiative energy back onto wire 10 and thereby limit radiative heat loss away from wire 10, to control the cooling temperature profile of wire 10.

While the particular heat-textured superconductor as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

We claim:

1. A superconductive wire including a ceramic superconductor coating and a continuous elongated wire substrate supporting said coating and having an elongated dimension and a dimension perpendicular to said elongated dimension, said superconductive wire prepared by a process which comprises the steps of:
   (A) providing a continuous elongated polycrystalline wire substrate having a radially curved surface and a plurality of randomly aligned crystal faces on said surface, wherein said substrate is formed from a metal or a metal alloy selected from the group consisting of nickel, iron, chromium, aluminum, manganese, magnesium, titanium, and mixtures thereof, said metal alloy optionally including up to 4.4% by weight of silicon;
   (B) depositing a superconductor coating on said substrate, wherein said superconductor coating is selected from a group consisting of bismuth-based superconductors, thallium-based superconductors, and rare earth-based superconductors having the generalized formula RE $Ba_2Cu_3O_{7-x}$ where RE is a rare earth element and x is between about 0 and 0.5, rare earth-based superconductors having the generalized formula RE $Ba_2Cu_4O_8$, and mixtures thereof;
   (C) continuously drawing said coated wire substrate along said elongated dimension through a heating zone at a drawing rate of up to about one meter per hour to heat contiguous portions of said ceramic superconductor coating;
   (D) heating said portion of said superconductor coating in said heating zone to an elevated temperature about equal to or greater than the peritectic temperature of said ceramic superconductor coating, said heating being substantially uniform across said dimension perpendicular to said elongated dimension of said substrate;
   (E) withdrawing said portion of said heated superconductor coating from said heating zone at said drawing rate to establish a temperature gradient along said elongated dimension of said substrate and said superconductor coating coated thereon; and
   (F) cooling said superconductor coating to below said elevated temperature to thereby facilitate growth of superconducting ceramic crystalline grains in said superconductor coating and to grow said grains in a direction substantially parallel to said elongated dimension of said substrate resulting in said superconductive wire.

2. The product of claim 1 wherein said substrate is substantially resistant to oxidation.

3. The product of claim 1 wherein said wire substrate is substantially cylindrical.

4. The product of claim 3 wherein said substrate is approximately fifty microns in diameter, and said ceramic superconductor coating is deposited on said substrate to a depth of approximately seventy-five microns.

5. The product of claim 3 wherein said superconductor coating is held in compression when said substrate is linearly configured.

6. The product of claim 1 wherein said substrate comprises iron, chromium and aluminum.

7. The product of claim 1 wherein said substrates comprises nickel, aluminum, silicon and manganese.

8. The product of claim 1 wherein said substrates comprises nickel, chromium and silicon.

9. The product of claim 1 wherein said crystalline grains of said superconductive wire are substantially co-parallel and form a layered laminate structure.

10. The product of claim 1 wherein said crystalline grains of said superconductive wire form a plurality of substantially co-parallel, extended parallelpipeds.

11. The product of claim 1 wherein said wire substrate has a rhodium (Rh) layer between said substrate and said superconductor coating.

12. The product of claim 1 wherein said wire substrate has a protective layer of RE $Ba_2Cu_3O_{7-x}$ between said substrate and said superconductor coating, wherein x is between about 0 and 0.5.

13. The product of claim 1 wherein said processing is accomplished in a substantially pure oxygen atmosphere.

14. The product of claim 1 wherein said drawing step is accomplished at a rate of approximately one-tenth to one meters per hour.

15. The product of claim 1 wherein said heating steps is accomplished by directing a laser beam onto said superconductor coating.

16. The product of claim 1 wherein said superconductor coating is heated during said heating step to within approximately ten (10)° C. above said peritectic temperature.

17. The product of claim 1 wherein said heating zone is less than approximately one millimeter in length in said elongated dimension.

18. The product of claim 1 wherein said superconductor coating is annealed subsequent to said cooling step by maintaining said superconductor coating in a substantially pure oxygen atmosphere at a temperature of approximately 400°–500° C. for approximately three days.

19. The product of claim 1 wherein said superconductor coating is annealed subsequent to said cooling step by maintaining said superconductor coating in a substantially pure oxygen atmosphere at a temperature of approximately 840°–845° C., for two days.

20. A superconductive wire including a ceramic superconductor coating and a continuous elongated wire substrate supporting said coating and having an elongated dimension and a dimension perpendicular to said elongated dimension, said superconductive wire prepared by a process which comprises the steps of:

(A) providing a continuous elongated polycrystalline wire substrate having a radially curved surface and a plurality of randomly aligned crystal faces on said surface, wherein said substrate is formed from a metal or a metal alloy selected from the group consisting of nickel, iron, chromium, aluminum, manganese, magnesium, titanium, and mixtures thereof, said metal alloy optionally including up to 4.4% by weight of silicon;

(B) depositing a superconductor coating on said substrate, wherein said superconductor coating is selected from a group consisting of bismuth-based superconductors, thallium-based superconductors, and rare earth-based superconductors having the generalized formula RE $Ba_2Cu_3O_{7-x}$ where RE is a rare earth element and x is between about 0 and 0.5, rare earth-based superconductors having the generalized formula RE $Ba_2Cu_4O_8$, and mixtures thereof;

(C) doping said ceramic superconductor coating with a non-superconductive carrier element;

(D) continuously drawing said coated wire substrate along said elongated dimension through a heating zone at a drawing rate of up to about one meter per hour to heat contiguous portions of said ceramic superconductor coating;

(E) heating said portion of said superconductor coating in said heating zone to an elevated temperature greater than the temperature of said carrier element, but less than the temperature of said superconductor coating, said heating being substantially uniform across said dimension perpendicular to said elongated dimension of said substrate;

(F) withdrawing said portion of said heated superconductor coating from said heating zone at said drawing rate to establish a temperature gradient along said elongated dimension of said substrate and said superconductor coating coated thereon; and (G) cooling said superconductor coating to below said elevated temperature to thereby facilitate growth of superconducting ceramic crystalline grains in said superconductor coating and to grow said grains in a direction substantially parallel to said elongated dimension of said substrate resulting in said superconductive wire.

21. The product of claim 20 wherein said carrier element is silver (Ag).

22. The product of claim 20 wherein said carrier element is a compound of barium, copper, and oxygen (BaCuO).

23. The product of claim 20 wherein said superconductor coating is heated to approximately 1,000° C. during said heating step.

24. The product of claim 23 wherein said temperature gradient is established to be approximately 50° C. temperature change per millimeter in said elongated dimension of said wire substrate within approximately two millimeters of said heated portion.

* * * * *